(12) United States Patent
Nishimura

(10) Patent No.: US 8,173,357 B2
(45) Date of Patent: May 8, 2012

(54) METHOD OF FORMING ETCHING MASK, ETCHING METHOD USING THE ETCHING MASK, AND METHOD OF FABRICATING SEMICONDUCTOR DEVICE INCLUDING THE ETCHING METHOD

(75) Inventor: Eiichi Nishimura, Nirasaki (JP)

(73) Assignee: Tokyo Electron Limited (JP)

( * ) Notice: Subject to any disclaimer, the term of this patent is extended or adjusted under 35 U.S.C. 154(b) by 556 days.

(21) Appl. No.: 12/407,244

(22) Filed: Mar. 19, 2009

(65) Prior Publication Data

US 2009/0269682 A1 Oct. 29, 2009

(30) Foreign Application Priority Data

Apr. 25, 2008 (JP) .................................. 2008-115498

(51) Int. Cl.
*G03F 7/36* (2006.01)
(52) U.S. Cl. ............ 430/312; 430/5; 430/313; 430/317; 438/706; 438/736
(58) Field of Classification Search .............. 430/5, 313, 430/317; 438/706, 745, 736
See application file for complete search history.

(56) References Cited

U.S. PATENT DOCUMENTS

| | | | | |
|---|---|---|---|---|
| 2007/0275311 A1* | 11/2007 | Wang | ................................ | 430/5 |
| 2008/0305642 A1* | 12/2008 | Lee et al. | ...................... | 438/703 |
| 2009/0111058 A1* | 4/2009 | Ahn | .............................. | 430/312 |

FOREIGN PATENT DOCUMENTS

| | | |
|---|---|---|
| JP | 2007-27742 | 2/2007 |
| KR | 10-2008-0005716 | 1/2008 |
| KR | 10-0822622 | 4/2008 |

OTHER PUBLICATIONS

Notice of Grounds for Rejection issued by Korean Intellectual Property Office on Dec. 20, 2010, citing KR10-2008-0005716, KR10-0822622.

* cited by examiner

*Primary Examiner* — John Chu
(74) *Attorney, Agent, or Firm* — Cantor Colburn LLP

(57) ABSTRACT

The method of forming an etching mask includes: forming a mask layer on an object layer that is to be etched, to form an etching mask used in etching the object layer; forming a first mask layer on the mask layer, the first mask layer having a first pattern that is to be transferred onto the mask layer; forming a second mask layer on the first mask layer, the second mask layer having a second pattern that is to be transferred onto the mask layer; obtaining a third mask layer having the first pattern and the second pattern, by transferring the second pattern of the second mask layer onto the first mask layer; and forming the etching mask used in the etching of the object layer, by etching the mask layer using the third mask layer.

9 Claims, 14 Drawing Sheets

METHOD OF FORMING ETCHING MASK, ETCHING METHOD USING THE ETCHING MASK, AND METHOD OF FABRICATING SEMICONDUCTOR DEVICE INCLUDING THE ETCHING METHOD

CROSS-REFERENCE TO RELATED PATENT APPLICATIONS

This application claims the benefit of Japanese Patent Application No. 2008-115498, filed on Apr. 25, 2008, in the Japanese Patent Office, the disclosure of which is incorporated herein in its entirety by reference.

BACKGROUND OF THE INVENTION

1. Field of the Invention

The present invention relates to a method of forming an etching mask in a process of fabricating a semiconductor device, an etching method using the etching mask, and a method of fabricating a semiconductor device including the etching method.

2. Description of the Related Art

Recently, as components of semiconductor devices have been manufactured to have smaller sizes due to requests for large-scale integration (LSI), wires having a line width of, for example, 45 nm or 32 nm have been required. However, an etching mask for realizing this line width cannot be obtained using a conventional photolithography technology. Although an extreme ultra-violet (EUV) exposure technology using EUV light having a wavelength of 13.5 nm has been developed recently, such EUV exposure technology has not been commercialized so far.

Under the circumstances, a double-patterning technology has been highlighted as a potential measure to address this problem. For example, in the double-patterning technology disclosed in Japanese Patent Laid-open Publication No. 2007-022742 (FIGS. 1 and 3, hereinafter, referred to as reference 1), the following operations are performed. First, a lower sacrificial layer and an upper sacrificial layer are sequentially formed on a layer that is to be etched. Next, a first resist layer is applied on the upper sacrificial layer, and then, the first resist layer is patterned using a first photo mask to form a first resist mask having a first pattern. Thereafter, the first pattern is transferred onto the upper sacrificial layer by using the first resist mask.

Then, the first resist mask is removed and a cleaning process is performed, and a second resist layer is applied on the lower sacrificial layer so as to cover the upper sacrificial layer, onto which the first pattern has been transferred by etching. After that, the second resist layer is patterned using a second photo mask to form a second resist mask having a second pattern. Next, the first and second patterns are transferred onto the lower sacrificial layer using the upper sacrificial layer which has the first pattern transferred thereon and remains on the lower sacrificial layer, and using the second resist mask.

Finally, the layer to be etched is etched using the lower sacrificial layer on which the first and second patterns have been transferred.

As described above, according to the above-described double-patterning technology, patterning using the resist mask is performed twice and also transferring (etching) is performed twice. By doing this, patterns having an interval half of the interval of a pattern formed by single patterning and a single etching operation may be formed.

However, in the above-described double-patterning technology, etching is performed using a photomask, and this etching is performed again. Therefore, a wafer needs to be inserted/drawn into/from an etching device twice, and thus, the method flow becomes complex. Moreover, when a trimming operation of the resist mask or a side wall transfer operation is employed in order to realize finer patterns, the method flow becomes even more complex.

The complex method flow (or the complex wafer conveying path) reduces the yield of a method of manufacturing semiconductor devices, and accordingly, an etching method with a simple flow is necessary.

SUMMARY OF THE INVENTION

To address the above and/or other problems, the present invention provides a method of forming an etching mask, which may reduce the number and complexity of operations required to form the etching mask.

According to an aspect of the present invention, there is provided a method of forming an etching mask, the method including: forming a mask layer on an object layer that is to be etched, to form an etching mask for etching the object layer; forming a first mask layer on the mask layer, the first mask layer having a first pattern that is to be transferred onto the mask layer; forming a second mask layer on the first mask layer, the second mask layer having a second pattern that is to be transferred onto the mask layer; obtaining a third mask layer having the first pattern and the second pattern, by transferring the second pattern of the second mask layer onto the first mask layer; and forming the etching mask for etching the object layer, by etching the mask layer using the third mask layer.

The forming of the first mask layer may include: forming a first resist layer; forming a first resist pattern by patterning the first resist layer; forming a second resist pattern by contracting a resist portion of the first resist pattern; and forming a first inorganic layer on the second resist pattern.

The forming of the first mask layer may further include: forming a first anti-reflective layer on the mask layer, and wherein in the forming of the first resist layer, the first resist layer is formed on the first anti-reflective layer.

The first inorganic layer may be formed of silicon oxide.

The forming of the second mask layer may include: forming a second resist layer; forming a third resist pattern by patterning the second resist layer; forming a fourth resist pattern by contracting a resist portion of the third resist pattern; and forming a second inorganic layer on the fourth resist pattern.

The forming of the second mask layer may further include: forming a second anti-reflective layer on the first inorganic layer, and wherein in the forming of the second resist layer, the second resist layer is formed on the second anti-reflective layer.

The second inorganic layer may be formed of silicon oxide.

The mask layer may be formed of titanium nitride or silicon.

According to another aspect of the present invention, there is provided a method of etching an object layer that is to be etched, using the etching mask fabricated using the above described method.

According to another aspect of the present invention, there is provided a method of fabricating a semiconductor device, including the above etching method.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
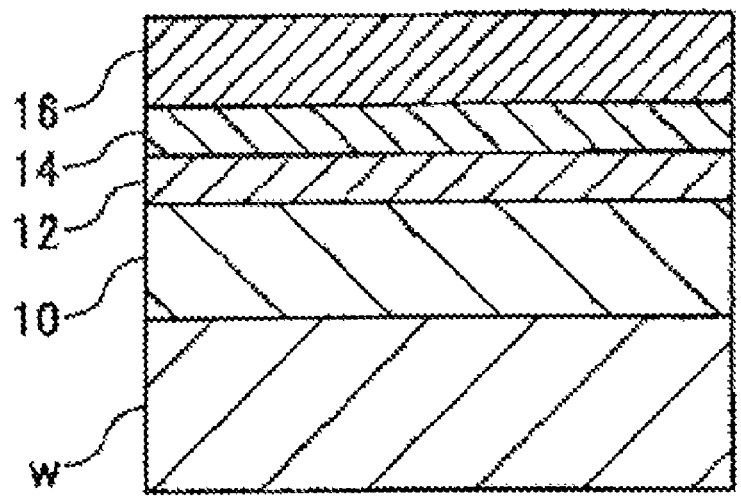
FIGS. 1A through 1F are views illustrating some operations of an etching method including a method of forming an etching mask according to an embodiment of the present invention, and showing cross-sections of a wafer after performing principal operations of the etching method.
Figure 1B:
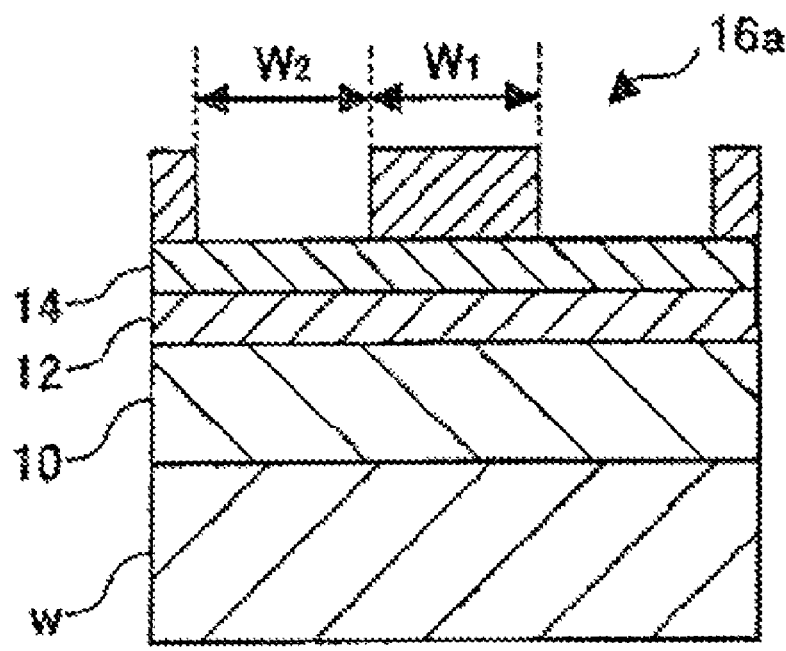

Hereinafter, a method of fabricating a semiconductor device according to embodiments of the present invention will be described with reference to accompanying drawings. In the accompanying drawings, like reference numerals denote like elements or components, and descriptions of the same elements will not be repeated. In addition, the drawings are not to represent relative ratios between members and components, or thicknesses of various layers, and thus, detailed thickness or sizes should be determined by one of ordinary skill in the art according to following embodiments.

FIGS. 1A through 1F and FIGS. 2A through 2F are views illustrating an etching method including a method of forming an etching mask according to an embodiment of the present invention. FIGS. 1A through 1F and FIGS. 2A through 2F schematically show cross-sections of a wafer after performing principal operations of the etching method. In addition, the etching method explained with reference to the above drawings is used in an operation of forming a contact hole, for example, in a silicon oxide layer.

[Operations of Forming a First Mask Layer]

Referring to FIG. 1A, a silicon oxide layer 10, a titanium nitride (TiN) layer 12, a bottom anti-reflective coating (BARC) 14, and a resist layer 16 are sequentially stacked on a silicon wafer W. The silicon oxide layer 10 is stacked on the wafer W via a tetraethoxysilane (TEOS) plasma chemical vapor deposition (CVD). The TiN layer 12 is stacked on the silicon oxide layer 10, for example, via a sputtering operation using a TiN target. The BARC 14 is applied on the TiN layer 12, for example, via a spin coating operation, and then the resist layer 16 is applied on the BARC 14, for example, via the spin coating operation.

Next, the resist layer 16 is exposed via a typical photolithography operation using a photo mask having a predetermined pattern. Then, the resist layer 16 is developed and peeled off, that is, the resist layer 16 is patterned, to thereby form a resist pattern. After that, the resist pattern is trimmed. In more detail, the water W after the formation of the resist pattern is conveyed into a plasma processing device so that the wafer W may be exposed to oxygen plasma. Thus, the resist pattern is constantly ashed and minimized in order to obtain a resist pattern 16a. A resist portion of the resist pattern 16a may have an upper surface that is nearly circular, and a diameter W1 of the resist portion may be about 60 nm. In addition, an interval (a width of an opening between resist portions) W2 may be about 60 nm, for example.

Thereafter, a silicon oxide layer 18 is formed on the BARC 14 so as to cover the resist pattern 16a. Since the silicon oxide layer 18 is stacked on the resist pattern 16a, the silicon oxide layer 18 is formed via the CVD operation which may be performed at a low temperature. An example of the CVD operation may be a molecular layer deposition (MLD) operation in which bis(tertiary-butylamino) silane (BTBAS) and oxygen plasma are alternately supplied so that an atomic or molecular layer level deposition may be performed. In addition, the silicon oxide layer 18 may have a thickness of about 15 nm, and a width of the silicon oxide layer 18 on side walls of the resist pattern 16a may be about 15 nm since deposition of a conformal layer is possible in the MLD operation. Therefore, a depressed portion of the silicon oxide layer 18 may have a width W3 of about 30 nm. The depressed portion of the silicon oxide layer 18 determines a size and location of holes formed in the silicon oxide layer 10 to be etched.

[Operations of Forming a Second Mask Layer]

Figure 1C:
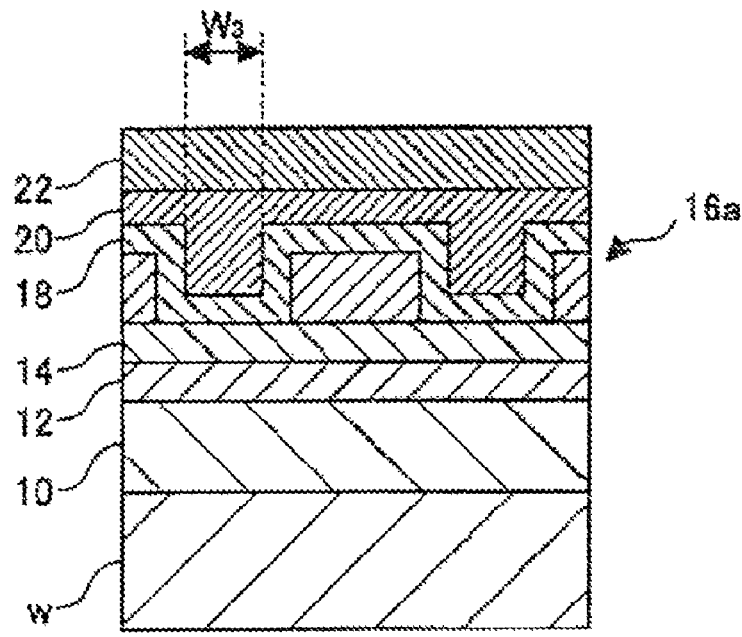

A BARC 20 is applied on the silicon oxide layer 18. The BARC 20 is formed by rotating the wafer W after dropping a liquid anti-reflective agent on the wafer W, and accordingly, the depressed portions of the silicon oxide layer 18 are filled with the BARC 20 due to the fluidity of the anti-reflective agent. Therefore, a surface of the BARC 20 becomes nearly flat. After that, a resist layer 22 is applied on the BARC 22 (FIG. 1C).

Figure 1D:
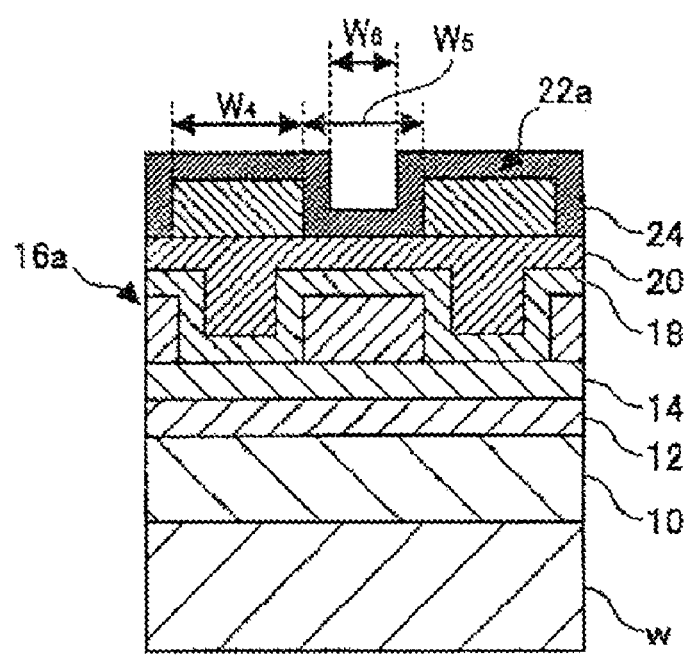

Next, when the patterning and trimming of the resist layer described with reference to FIG. 1A and the deposition of a silicon oxide layer are performed, a resist pattern 22a formed on the BARC 20 and a silicon oxide layer 24 formed to cover the resist pattern 22a on the BARC 20 are obtained as shown in FIG. 1D. The resist pattern 22a has the same shape as the resist pattern 16a. Therefore, a diameter W4 of a resist portion of the resist pattern 22a and a width W5 of an opening in the resist pattern 22a are the same as those of the resist pattern 16a, that is, about 60 nm. The resist pattern 22a is offset with respect to the resist pattern 16a by about 60 nm. That is, the resist portion in the resist pattern 22a is located above the opening of the resist pattern 16a (namely, the depressed portion of the silicon oxide layer 18). In addition, in order to form the resist pattern 22a, the photo mask used to form the resist pattern 16a may be used again. In addition, the silicon oxide layer 24 may be deposited via the MLD operation, and thus, the silicon oxide layer 24 may have a thickness of about 15 nm, which is equal to the thickness of the silicon oxide layer 18. Therefore, a width W6 of a depressed portion in the silicon oxide layer 24 is about 30 nm. The depressed portion determines a size and location of a hole which is formed in the silicon oxide layer 10 to be etched.

[Operations of Forming a Third Mask Layer]

Figure 1E:
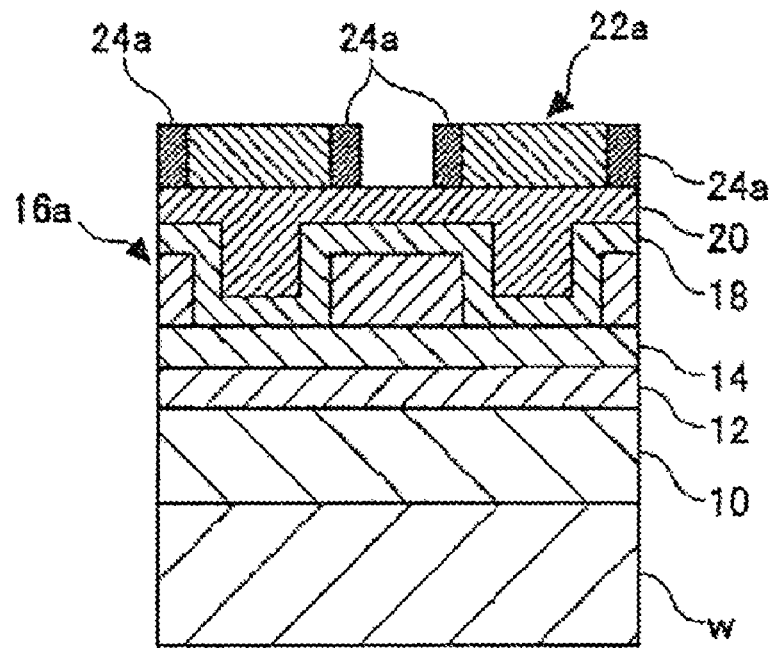

Next, an etch-back operation is performed on the silicon oxide layer 24. In the etch-back operation, a mixed gas formed of a fluorocarbon gas, such as $CF_4$, $C_4F_8$, $CHF_3$, $CH_3F$, or $CH_2F_2$, and Ar gas may be used as an etching gas, and the etched depth is about 15 nm. Accordingly, the BARC 20 and the resist pattern 22a are exposed as shown in FIG. 1E. In addition, since an anisotropic etching is performed using the above etching gas, silicon oxide portions 24a each having a width of about 15 nm remain on the side walls of the resist pattern 22a.

Figure 1F:
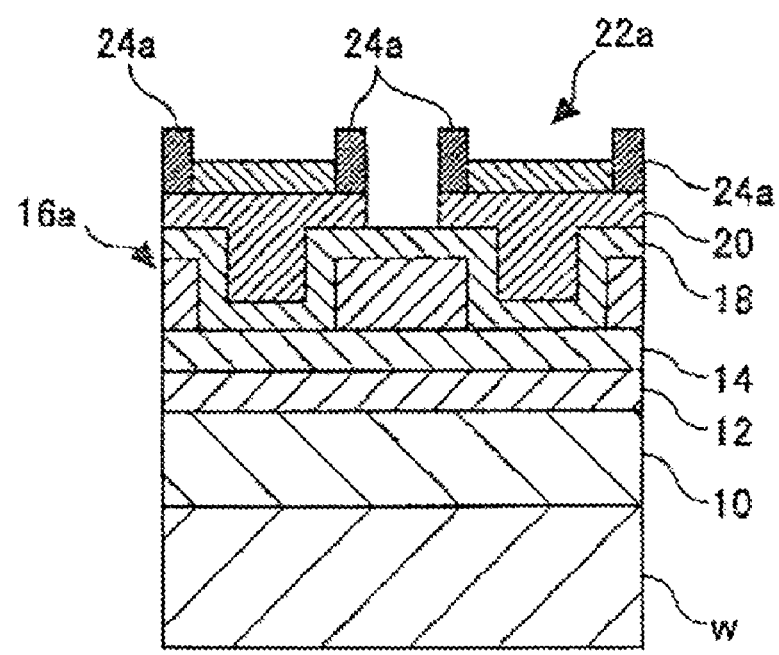

After that, the exposed portion of the BARC 20 is etched by, for example, oxygen plasma using the resist pattern 22a and the silicon oxide portions 24a as an etching mask, and thus, the silicon oxide layer 18 is exposed through the opening of the etching mask (FIG. 1F). At this time, the resist pattern 22a and the BARC may be etched together, and thus the resist pattern 22a becomes thin.

Figure 2A:
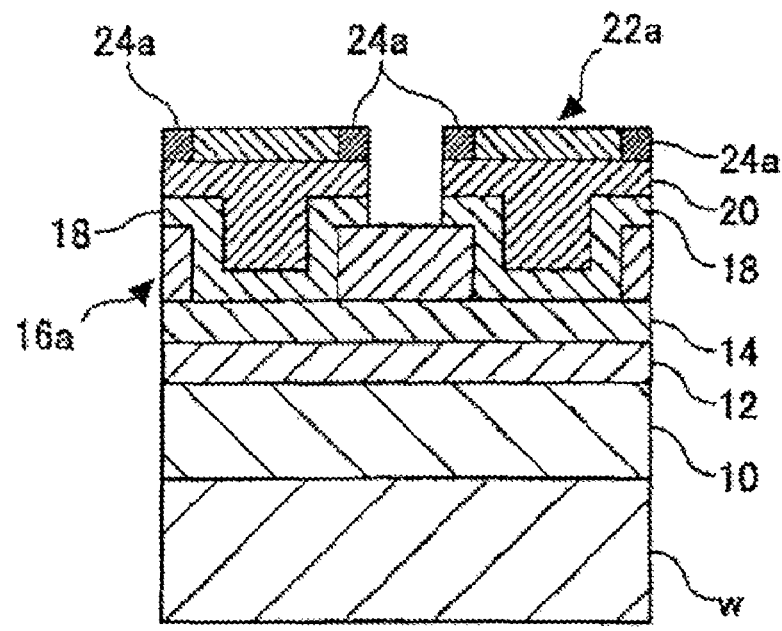
FIGS. 2A through 2F are views illustrating other operations of the etching method including the method of forming an etching mask according to the embodiment of the present invention, and showing cross-sections of the wafer after performing principal operations of the etching method.

Referring to FIG. 2A, the silicon oxide layer 18 exposed through the opening of the etching mask (FIG. 1F) is etched, and thus, the resist portion of the resist pattern 16a is exposed. In the above etching operation of the silicon oxide layer 18, a mixed gas formed of a fluorocarbon gas, such as $CF_4$, $C_4F_8$, $CHF_3$, $CH_3F$, or $CH_2F_2$, and Ar gas may be used as an etching gas. At this time, the silicon oxide portions 24a are also etched, thereby becoming thin.

Figure 2B:
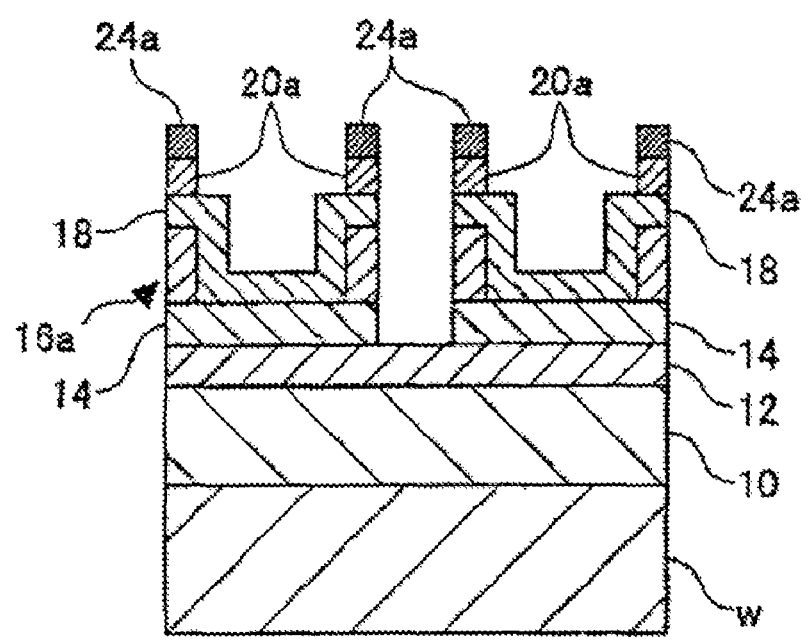

Next, the resist portion of the resist pattern 16a exposed through the opening of the etching mask (the resist pattern 22a and the silicon oxide portions 24a), and the BARC 14 under the exposed resist portion are etched, and thus, the TiN layer 12 is exposed through the opening as shown in FIG. 2B.

When the exposed resist portion and the BARC 14 are etched, the resist pattern 22a and the BARC 20 are also etched. Since the BARC 20 under the resist pattern 22a is also etched after the resist pattern 22a is etched out, the silicon oxide layer 18 under the BARC 20 is exposed (see FIG. 2B). In the above etching operation, a mixed gas formed of, for example, HBr and $CO_2$, may be used as an etching gas. Then, anisotropic etching may be performed, and thus, portions of the BARC 20 that exist under the silicon oxide portions 24a are not etched, but remain as BARC portions 20a. Therefore, the silicon oxide portions 24a may also remain, and the silicon oxide portions 24a may operate as an etching mask in the next etching operations.

Figure 2C:
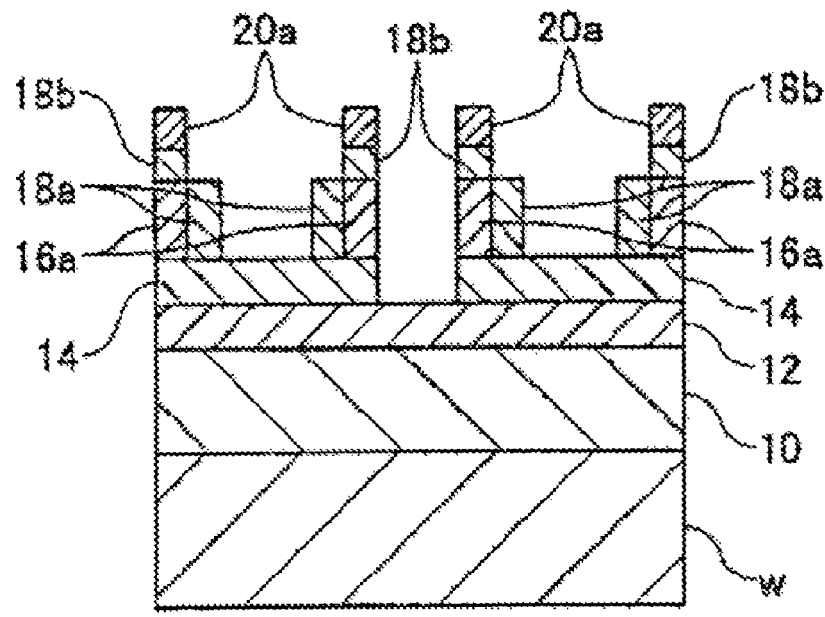

In addition, as shown in FIG. 2C, the silicon oxide layer 18 is etched. In this etching operation, a mixed gas formed of a fluorocarbon gas such as $CF_4$, $C_4F_8$, $CHF_3$, $CH_3F$, or $CH_2F_2$, and Ar gas may be used as an etching gas, and an etched depth is about 15 nm, which is nearly equal to the thickness of the silicon oxide layer 18. Therefore, after performing the etching operation of the silicon oxide layer 18, the BARC 14 under the silicon oxide layer 18 is exposed, and at the same time, silicon oxide portions 18a remain on side walls of the resist pattern 16a (see FIG. 2C). In addition, since the BARC portions 20a operate as a mask, portions of the silicon oxide layer 18 that exist under the BARC portions 20a are not etched, but remain as silicon oxide portions 18b. Also, the silicon oxide portions 24a located on the outermost side shown in FIG. 2B are etched and removed, and thus, the BARC portions 20a are exposed.

A diameter of an opening defined by the silicon oxide portions 18a is about 30 nm as described with reference to FIG. 1C. In addition, the opening between silicon oxide portions 18b also has a diameter of about 30 nm as described with reference to FIG. 1D.

Figure 2D:
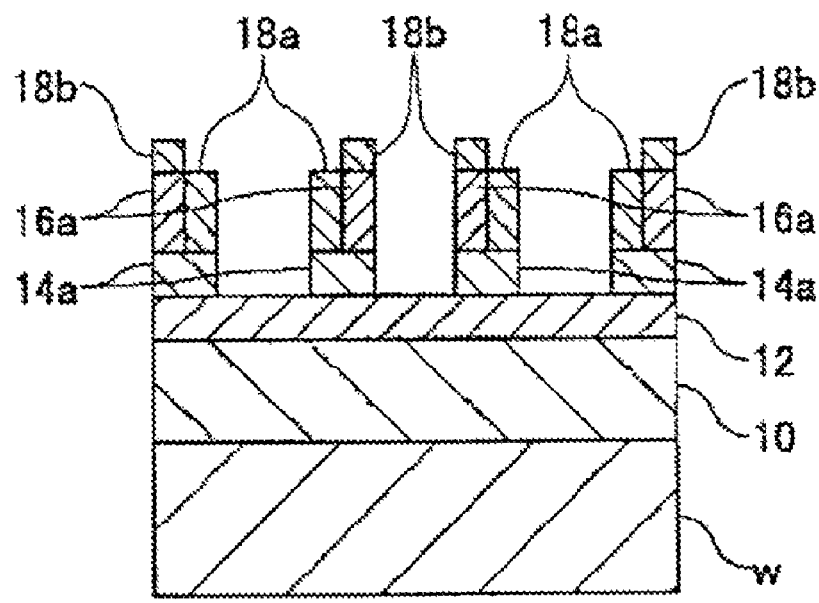

Subsequently, the BARC 14 exposed through the opening defined by the silicon oxide portions 18a is etched using the silicon oxide portions 18a and 18b and the resist pattern 16a as an etching mask, and thus, the TiN layer 12 is exposed (FIG. 2D). Oxygen plasma may be used in the etching operation of the exposed portion of BARC 14. When the exposed portion of the BARC 14 is etched out, the BARC portions 20a are also etched.

According to the above operations, the silicon oxide portions 18a and 18b, the resist pattern 16a, and BARC portions 14a remain on the TiN layer 12, as shown in FIG. 2D. These remaining portions are used in an operation of etching the TiN layer 12, which will be described later. That is, the silicon oxide portions 18a and 18b, the resist pattern 16a, and the BARC portions 14a are used as an etching mask (third mask layer) for etching the TiN layer 12. When comparing FIGS. 1D and FIG. 2D, the etching mask for etching the TiN layer 12 has openings located on portions corresponding to the depressed portions of the silicon oxide layers 18 and 24.

[Operations of Forming an Etching Mask]

Figure 2E:
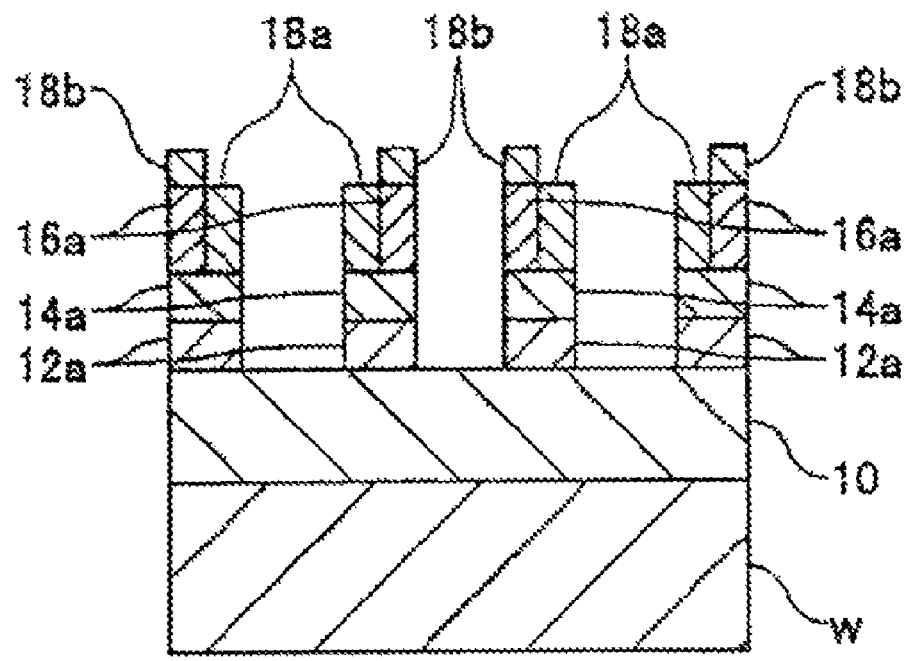

When the TiN layer 12 is etched using the above-described etching mask for etching the TiN layer, a hard mask 12a is obtained as shown in FIG. 2E. The etching of the TiN layer 12 may be anisotropic etching using an etching gas including $Cl_2$ gas and $N_2$ gas. Otherwise, hydrogen bromide (HBr) including $Cl_2$ and $N_2$ may be used.

[Etching Operations]

Figure 2F:
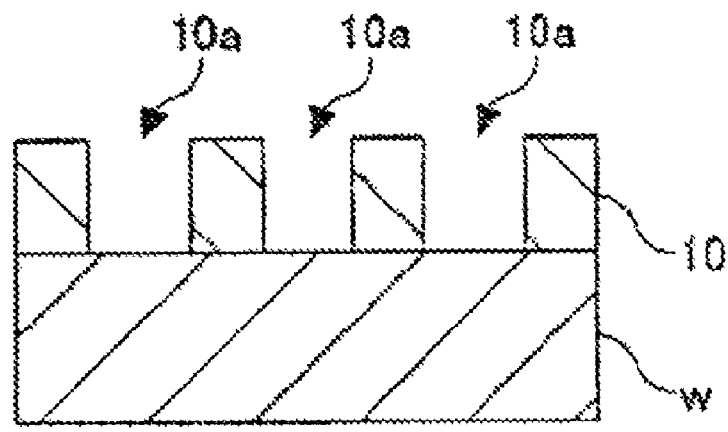

The silicon oxide layer 10 is etched using the hard mask 12a, and the hard mask 12a and the silicon oxide portions 18a and 18b are removed. Then, a cleaning process is performed, and thus, as shown in FIG. 2F, holes 10a exposing the wafer W are formed in the silicon oxide layer 10, and accordingly, the etching operation according to the present embodiment is finished. In addition, each of the holes 10a may have a diameter of about 30 nm, which is the same as the width W3 of the depressed portion of the silicon oxide layer 18 and the width W6 of the depressed portion of the silicon oxide layer 24. Also, distances between the holes 10a are also about 30 nm.

As described above, according to the etching method including the operations of forming the etching mask of the present embodiment, the resist layer 16 is patterned (via coating, exposure, development, and peeling of a resist), the patterned resist layer 16 is trimmed, and the silicon oxide layer 18 is deposited. After that, the BARC 20 is applied, the resist layer 22 is patterned, the patterned resist layer 22 is trimmed, and the silicon oxide layer 24 is deposited, and then, the holes 10a are formed in the silicon oxide layer 10 by a series of etching operations. That is, while the operations are performed from the operation of formation of the resist layer 16 (FIG. 1A) to the operation of formation of the holes 10a are performed, the wafer W is conveyed to a resist track and an exposure device combined with the resist track (patterning), an etching device (trimming), and a thin film deposition device (deposition of silicon oxide layer), then the above conveying order is repeated after applying the BARC 20, and the wafer W is conveyed to the etching device to perform the remaining etching operations. As described above, all of the etching operations are performed in one etching device except for the process of trimming the resist layer.

In addition, the etching device may have a plurality of gas supplying lines, and may supply the etching gas (hydrocarbon) for etching the silicon oxide layers 18 and 24, the gas (oxygen) for trimming the resist layers 16 and 22 or for etching the BARC 14 and 20, the etching gas (chlorine) for etching the TiN layer 12, and Ar gas or $N_2$ gas as a diluent gas into a chamber. Also, the etching device may include a plasma source for generating plasma in the chamber.

COMPARATIVE EXAMPLE

An etching method according to a comparative example will be described as follows for clarifying the effects of the etching method according to the above embodiment of the present invention. In the etching method of the comparative example reviewed by the present inventor, holes nearly identical to the holes 10a formed by the etching method of the above embodiment of the present invention may be formed. In more detail, the etching method of the comparative example is a combination of a conventional double-patterning with trimming of a resist layer and side wall transfer (SWT). Hereinafter, the etching method according to the comparative example will be described with reference to FIGS. 3A through 5C.

Figure 3A:
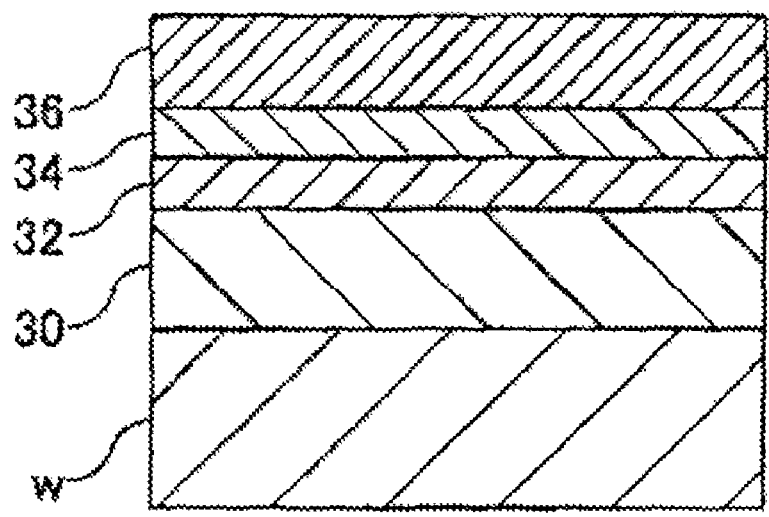
FIGS. 3A through 3F are views illustrating some operations of an etching method including a method of forming an etching mask according to a comparative example, and showing cross-sections of a wafer after performing principal operations of the etching method.
Figure 3B:
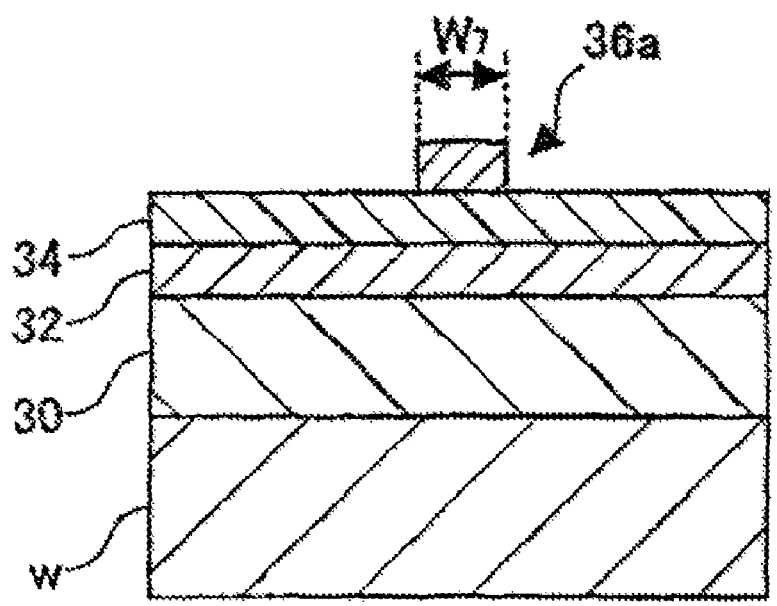
Figure 3C:
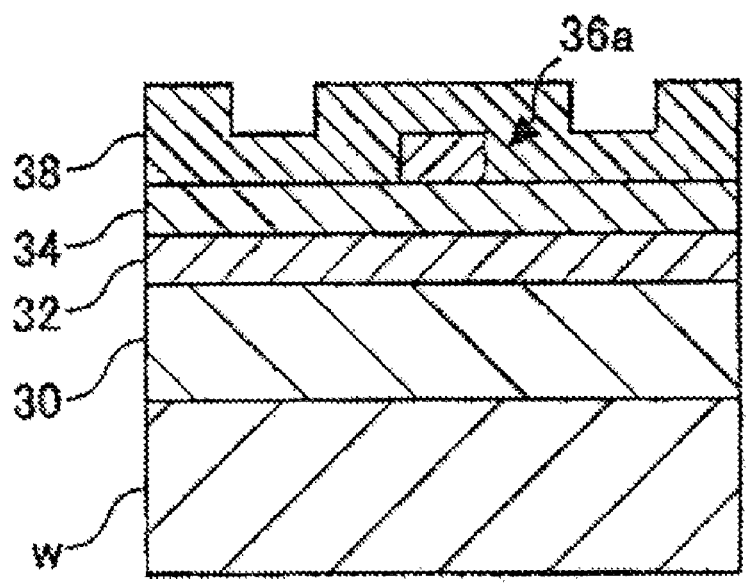

Referring to FIG. 3A, a silicon oxide layer 30, a TiN layer 32, a lower BARC 34, and a resist layer 36 are sequentially stacked on a silicon wafer W. Next, when the resist layer 36 is patterned and trimmed, a contracted resist pattern 36a is formed as shown in FIG. 3B. A resist portion of the resist pattern 36a has an upper surface that is nearly circular, and a diameter W7 of the resist portion is about 30 nm.

Figure 3D:
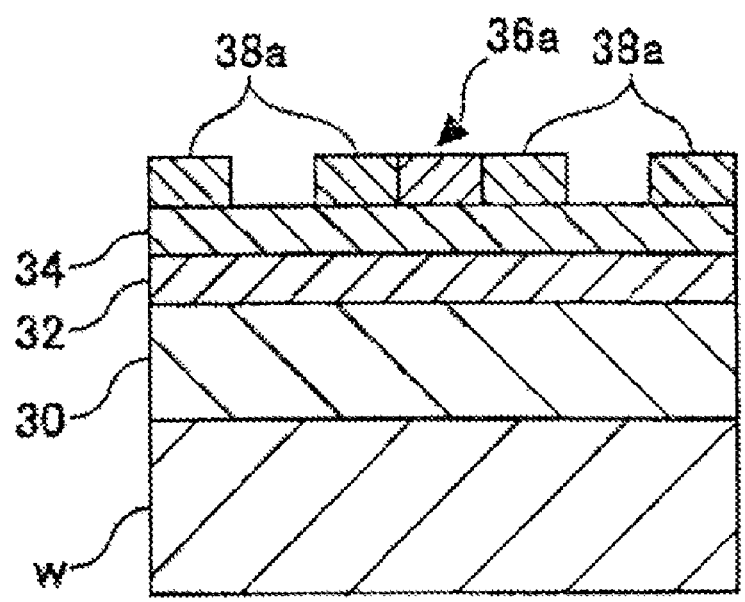
Figure 3E:
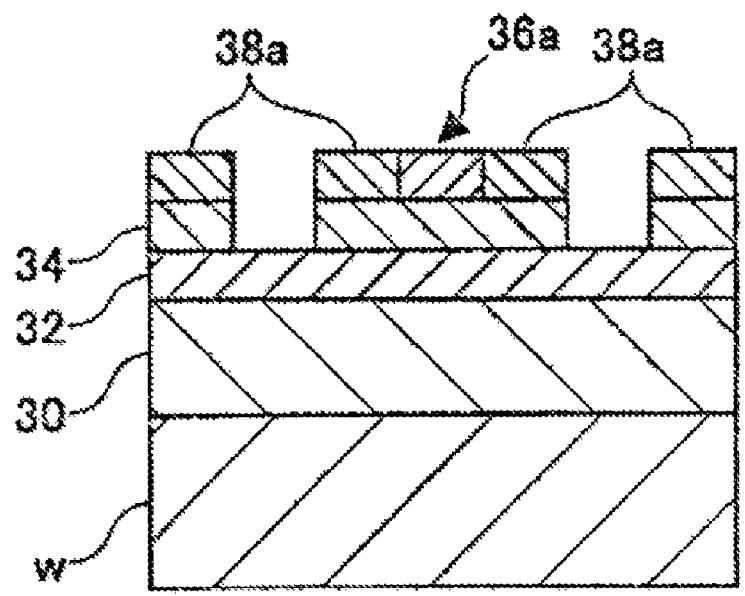
Figure 3F:
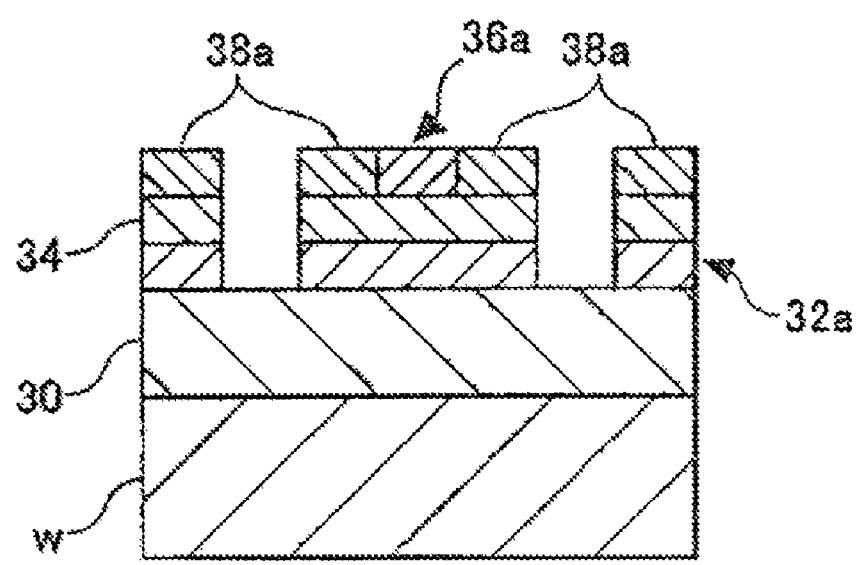

In addition, a silicon oxide layer 38 is deposited to a thickness of about 15 nm on the lower BARC 34 so as to cover the resist pattern 36a using an MLD operation (FIG. 3C), and then the silicon oxide layer 38 is etched back (FIG. 3D). Accordingly, an etching mask including the resist pattern 36a and silicon oxide portions 38a is obtained. The lower BARC 34 is etched (FIG. 3E) using the etching mask, and the TiN layer 32 is etched (FIG. 3(f)) using the etching mask. Since the TiN layer 32 is processed to serve as a hard mask 32a used for etching the silicon oxide layer 30 under the TiN layer 32, the above etching operation of FIG. 3F corresponds to a first hard mask etching operation.

Figure 4A:
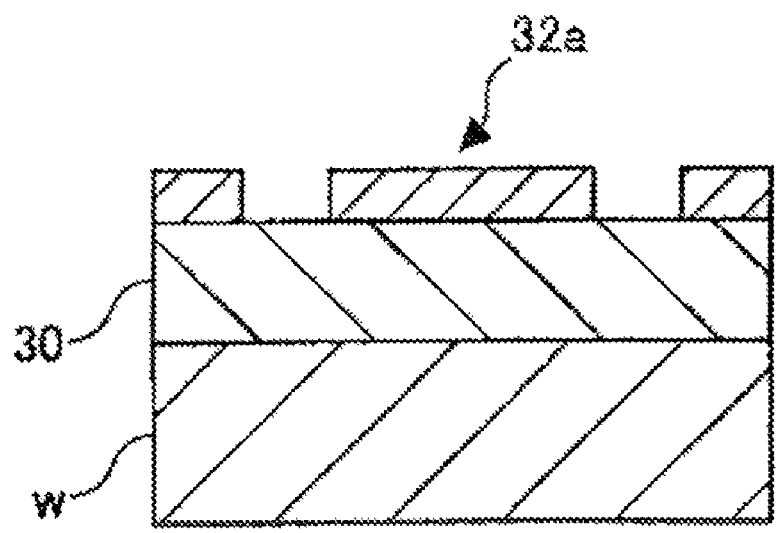
FIGS. 4A through 4F are views illustrating other operations of the etching method including the method of forming an etching mask according to the comparative example, and showing cross-sections of the wafer after performing principal operations of the etching method.
Figure 4B:
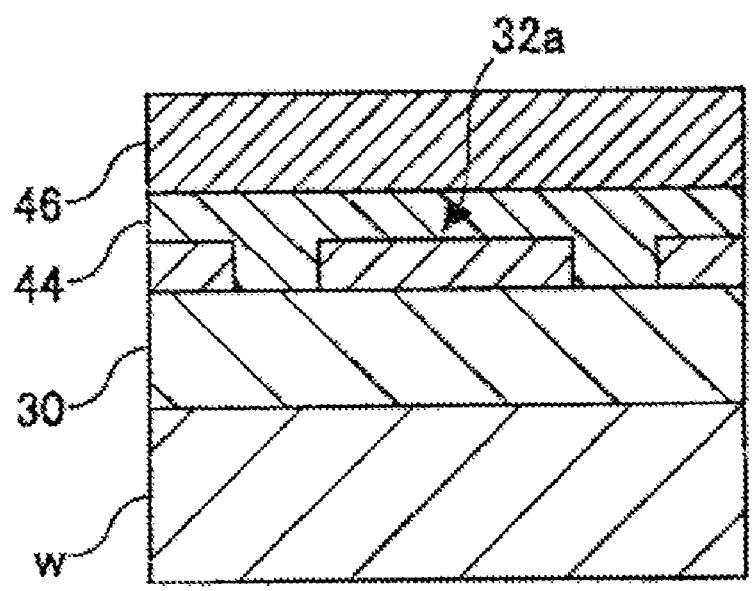

Next, the etching mask used in the first hard mask etching operation is removed and a cleaning process is performed, and thus, the hard mask 32a is obtained as shown in FIG. 4A.

Figure 4C:
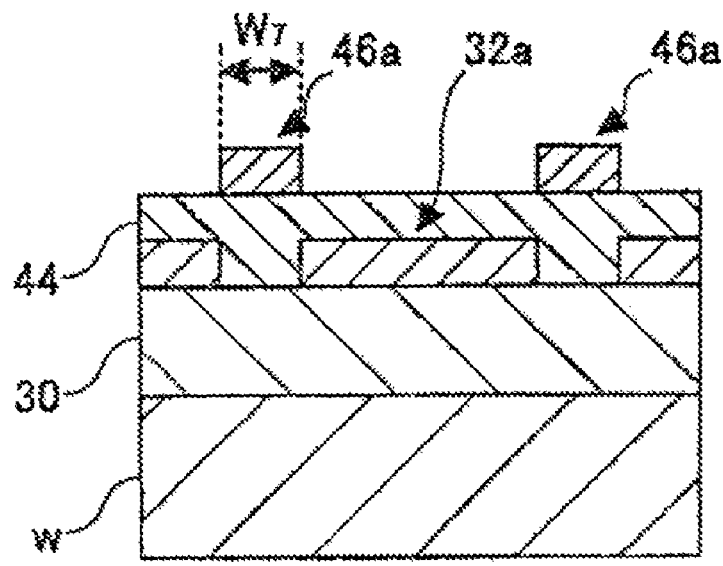
Figure 4D:
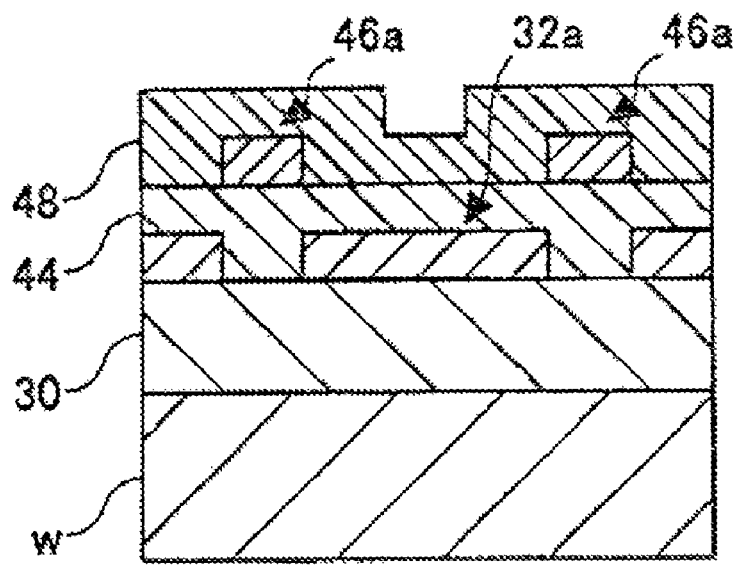

After that, a BARC 44 is applied on the silicon oxide layer 30 so as to cover the hard mask 32a, and a resist layer 46 is applied on the BARC 44. In addition, the resist layer 46 is patterned and trimmed to form a contracted resist pattern 46a (FIG. 4C). A resist portion in the resist pattern 46a has an upper surface that is nearly circular, and has a diameter W7 of about 30 nm.

Figure 4E:
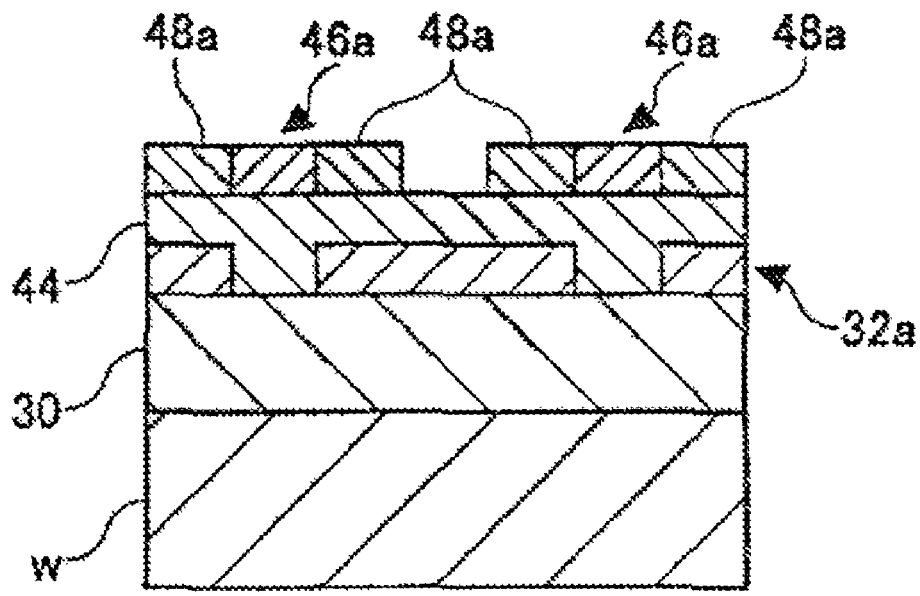
Figure 4F:
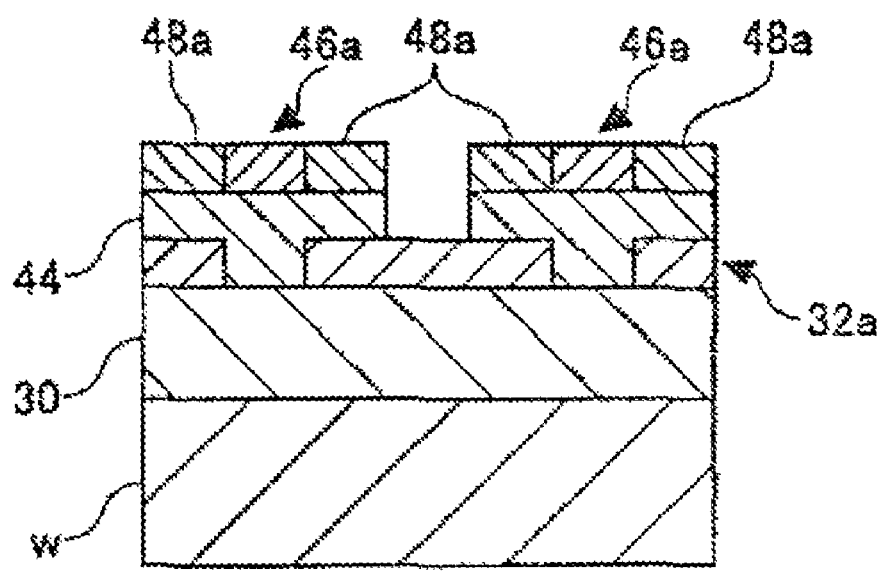
Figure 5A:
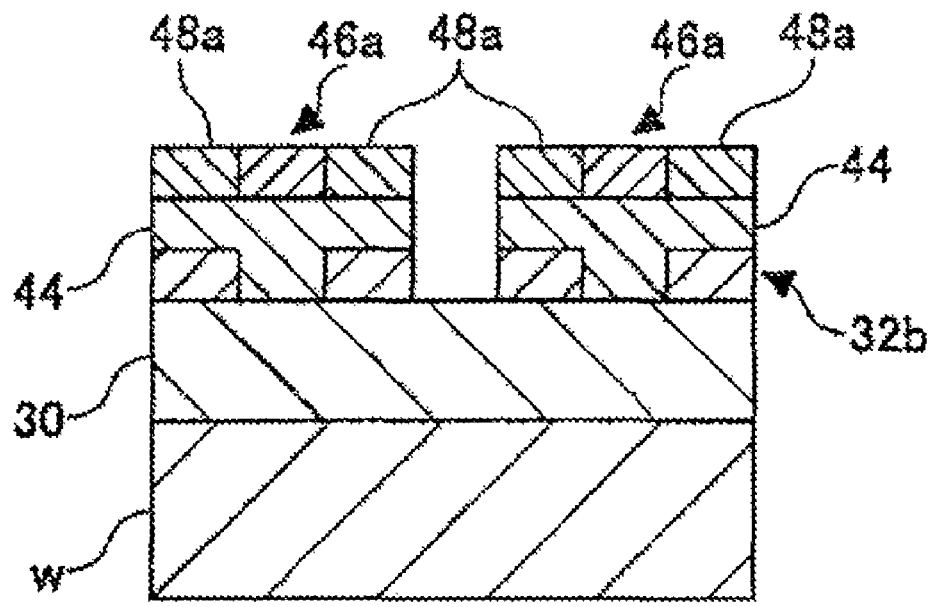
FIGS. 5A through 5C are views illustrating other operations of the etching method including the method of forming an etching mask according to the comparative example, and showing cross-sections of the wafer after performing principal operations of the etching method.

Next, a silicon oxide layer 48 is deposited to a thickness of about 15 nm on the BARC 44 using the MLD process so as to cover the resist pattern 46a (FIG. 4D), and the silicon oxide layer 48 is etched back (FIG. 4E). Accordingly, an etching mask including the resist pattern 46a and silicon oxide portions 48a is obtained. Then, the BARC 44 is etched using the etching mask (FIG. 4F), and the hard mask 32a is etched in a second hard mask etching operation (FIG. 5A).

Figure 5B:
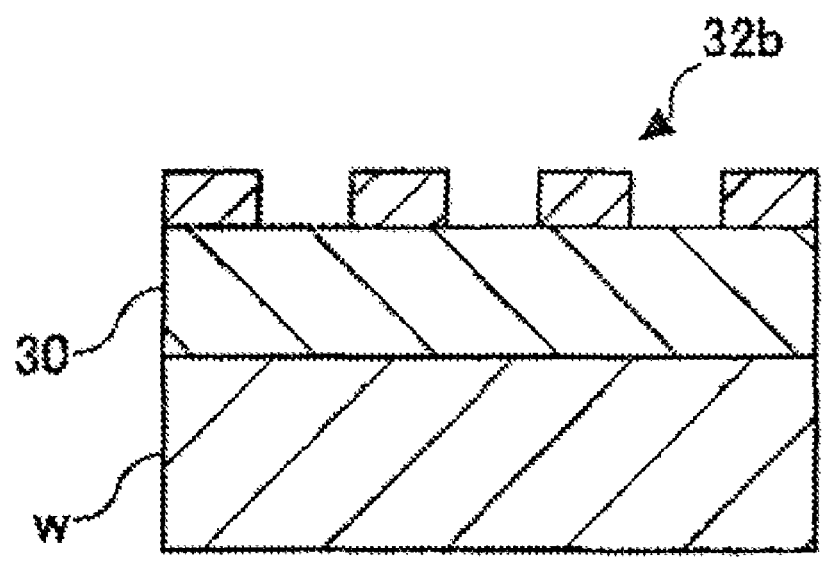
Figure 5C:
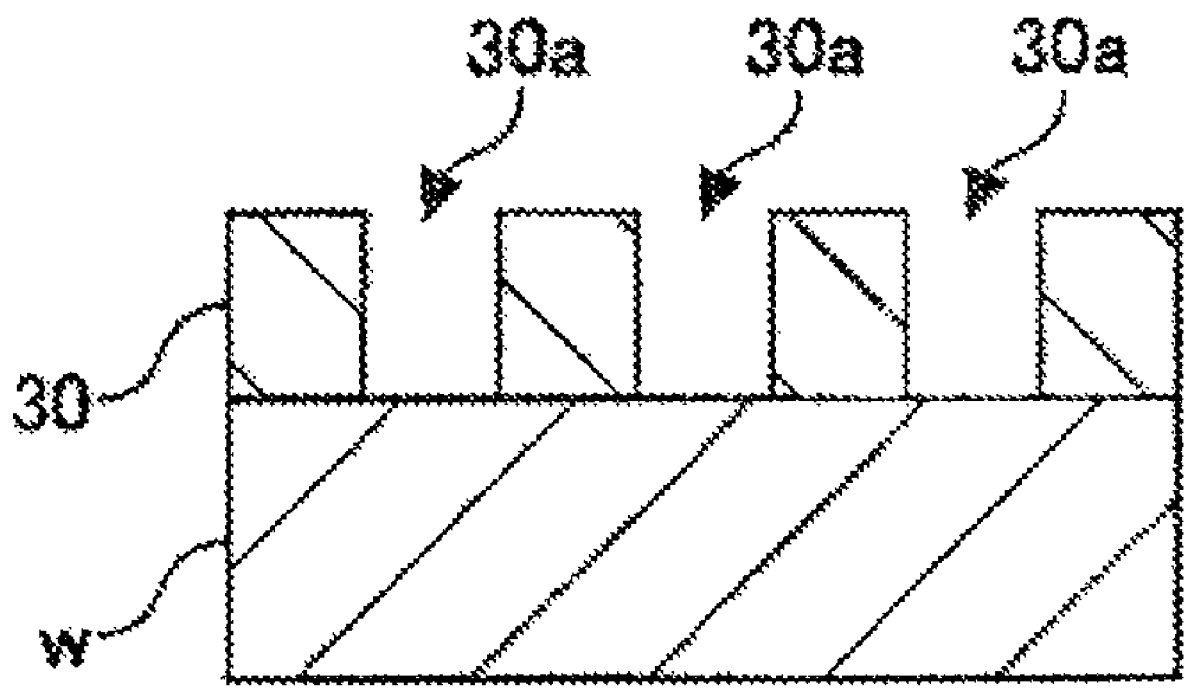

In addition, when the etching mask used in the second hard mask etching operation is removed and a cleaning process is performed, a hard mask 32b is obtained as shown in FIG. 5B. The silicon oxide layer 30 is etched using the hard mask 32b to form holes 30a in the silicon oxide layer 30 as shown in FIG. 5C.

According to the etching method of the comparative example, after performing the first hard mask etching operation, that is, the patterning and trimming of the resist layer, the deposition of the silicon oxide layer, and the etch-back of the silicon oxide layer, the BARC and the resist layer are applied. Then, the second hard mask etching operation is performed, that is, the patterning and trimming of the resist layer, the deposition of the silicon oxide layer, and the etch-back of the silicon oxide layer are performed again. That is, in a process from the formation of the resist layer 36 (FIG. 3A) to the formation of the holes (FIG. 5C), the wafer W is conveyed to the resist track and the exposure device (patterning of the resist layer) combined with the resist track, the etching device (trimming), the thin film deposition device (deposition of the silicon oxide layer), and the etching device (etch-back of the silicon oxide layer and hard mask etching), and the above conveying operations are repeated. As described above, according to the comparative example, the wafer W needs to be inserted/drawn into/from the etching device twice, except for the insertion/withdrawal of the wafer for performing the trimming process.

On the other hand, according to the etching method of the above embodiment of the present invention, the wafer W moves along a route including the resist track (exposure device)→the etching device→the thin film deposition device twice, however, remaining etching operations may be performed in one etching device. Therefore, the wafer W is inserted/drawn into/from the etching device once. Therefore, the conveying route of the wafer W may be reduced due to the simplification of the etching method. Moreover, according to the etching method of the above embodiment of the present invention, the holes 10a having the diameter of about 30 nm may be formed as described above, and thus, a critical dimension (CD) of 30 nm may be realized even using conventional equipment.

In addition, since the etching mask is formed again after forming a hard mask in one etching operation, the photo masks and a photomask to be formed later may be incorrectly aligned. However, according to the etching method of the above embodiment of the present invention, since the alignment of photo masks is finished before performing the substantial etching operation, the photo masks may not be incorrectly aligned.

As described above, according to the etching method of the above embodiment of the present invention, the etching operations may be simpler than the etching operations in the conventional etching method using double-patterning.

While the present invention has been particularly shown and described with reference to the above embodiment and the comparative example, the present invention is not limited to this embodiment, and various modifications and various other embodiments may be considered without departing from the spirit and scope of the invention as defined by the appended claims.

For example, an inorganic layer such as a silicon nitride layer or a silicon oxynitride layer may be deposited on the resist patterns 16a and 22a, instead of depositing the silicon oxide layers 18 and 24. In addition, instead of forming the BARC 14, a spin-on-glass(SOG) layer, a silicon oxynitride layer, or a silicon oxide layer grown in a low temperature may be formed on the TiN layer 12, or a composite layer formed of the above layers and the BARC may be formed on the TiN layer 12. A SOG layer, an organic SOG layer, or a polyimide that may provide a high surface flatness may be formed on the silicon oxide layer 18, and after that, the BARC may be formed thereon. Accordingly, the resist pattern 22a may have end portions with clear contours, and moreover, the hard mask 12a having excellent dimensional accuracy may be obtained.

In addition, a polysilicon layer instead of the TiN layer 12 may be formed on the silicon oxide layer 10 and the hard mask 12a used to etch the silicon oxide layer 10 may be formed of the polysilicon layer.

In the etching method according to the above embodiment of the present invention, the holes are formed by etching the silicon oxide layer, however, the etching method of the present invention may be applied to cases where wires are formed by etching a metal layer. In addition, the etching method of the present invention may be used in a method of fabricating several types of semiconductor devices, for example, memory devices and logic devices.

According to the present invention, the number of etching operations may be reduced, and the devices required to perform the etching operations may be used efficiently.

What is claimed is:

1. A method of forming an etching mask, the method comprising:

forming a mask layer on an object layer that is to be etched, to form an etching mask for etching the object layer;

forming a first mask layer on the mask layer, the first mask layer having a first pattern that is to be transferred onto the mask layer;

forming a second mask layer on the first mask layer, the second mask layer having a second pattern that is to be transferred onto the mask layer;

obtaining a third mask layer having the first pattern and the second pattern, by transferring the second pattern of the second mask layer onto the first mask layer; and forming the etching mask for etching the object layer, by etching the mask layer using the third mask layer, wherein the forming of the first mask layer comprises:
   forming a first resist layer;
   forming a first resist pattern by patterning the first resist layer;
   forming a second resist pattern by contracting a resist portion of the first resist pattern; and
   forming a first inorganic layer on the second resist pattern.

2. The method of claim 1, wherein the forming of the first mask layer further comprises: forming a first anti-reflective layer on the mask layer, and wherein in the forming of the first resist layer, the first resist layer is formed on the first anti-reflective layer.

3. The method of claim 1, wherein the first inorganic layer is formed of silicon oxide.

4. The method according to claim 1, wherein the forming of the second mask layer comprises:

forming a second resist layer;
   forming a third resist pattern by patterning the second resist layer;
   forming a fourth resist pattern by contracting a resist portion of the third resist pattern; and
   forming a second inorganic layer on the fourth resist pattern.

5. The method of claim 4, wherein the forming of the second mask layer further comprises: forming a second anti-reflective layer on the first inorganic layer, and wherein in the forming of the second resist layer, the second resist layer is formed on the second anti-reflective layer.

6. The method of claim 4, wherein the second inorganic layer is formed of silicon oxide.

7. The method according to claim 1, wherein the mask layer is formed of titanium nitride or silicon.

8. A method of etching an object layer that is to be etched, using the etching mask fabricated using the method according to claim 1.

9. A method of fabricating a semiconductor device, comprising the etching method of claim 8.

* * * * *